(12) United States Patent
Fornara et al.

(10) Patent No.: US 8,399,280 B2
(45) Date of Patent: Mar. 19, 2013

(54) METHOD FOR PROTECTING AN INTEGRATED CIRCUIT CHIP AGAINST LASER ATTACKS

(75) Inventors: Pascal Fornara, Pourrieres (FR);
Fabrice Marinet, Chateauneuf le Rouge (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 2 days.

(21) Appl. No.: 12/897,217

(22) Filed: Oct. 4, 2010

(65) Prior Publication Data

US 2011/0080190 A1 Apr. 7, 2011

(30) Foreign Application Priority Data

Oct. 5, 2009 (FR) ...................... 09 56920

(51) Int. Cl.
*H01L 21/00* (2006.01)
(52) U.S. Cl. .......... 438/58; 438/143; 438/310; 438/402; 438/471; 438/473
(58) Field of Classification Search .................... 438/58, 438/143, 310, 402, 471–477, 8
See application file for complete search history.

(56) References Cited

U.S. PATENT DOCUMENTS

| | | | |
|---|---|---|---|
| 4,203,780 A * | 5/1980 | Matsushita et al. | 438/530 |
| 6,191,618 B1 | 2/2001 | Gayles et al. | |
| 6,709,512 B2 * | 3/2004 | Yamoto et al. | 117/90 |
| 2003/0057522 A1 | 3/2003 | Francis et al. | |
| 2005/0040500 A1 | 2/2005 | Henmi | |
| 2006/0264068 A1 * | 11/2006 | Yoneda | 438/795 |
| 2008/0138963 A1 * | 6/2008 | Yamazaki et al. | 438/471 |
| 2008/0286944 A1 | 11/2008 | Thill | |
| 2009/0102024 A1 * | 4/2009 | Takahi et al. | 257/629 |

FOREIGN PATENT DOCUMENTS

| | | |
|---|---|---|
| DE | 100337256 A1 | 6/2004 |
| JP | 11250215 A | 9/1999 |

OTHER PUBLICATIONS

French Search Report dated May 12, 2010 from corresponding French Application No. 09/56920.
French Search Report dated May 12, 2010 from related French Application No. 09/56923.
Binns M.J., *Effective Intrinsic Gettering for 200MM and 300 MM P/P-Wafers in a Low Thermal Budget 0.13 m Advanced CMOS Logic Process*, 9th Int. Symmp. Silicon Materials Science & Technology, Philadelphia, May 12-17, 2002,; XP002581984.
Office Action dated Jan. 6, 2012 for U.S. Appl. No. 12/897,231, filed Oct. 4, 2010.

* cited by examiner

*Primary Examiner* — Thien F Tran
(74) *Attorney, Agent, or Firm* — Wolf, Greenfield & Sacks, P.C.

(57) ABSTRACT

A method for protecting, against laser attacks, an integrated circuit chip formed inside and on top of a semiconductor substrate and including in the upper portion of the substrate an active portion in which are formed components, this method including the steps of: forming in the substrate a gettering area extending under the active portion, the upper limit of the area being at a depth ranging between 5 and 50 µm from the upper surface of the substrate; and introducing diffusing metal impurities into the substrate.

33 Claims, 2 Drawing Sheets

METHOD FOR PROTECTING AN INTEGRATED CIRCUIT CHIP AGAINST LASER ATTACKS

CROSS REFERENCE TO RELATED APPLICATIONS

This application claims the priority benefit of French patent application Ser. No. 09/56920, filed on Oct. 5, 2009, entitled "Method for Protecting an Integrated Circuit Chip Against Laser Attacks," which is hereby incorporated by reference to the maximum extent allowable by law.

BACKGROUND OF THE INVENTION

1. Field of the Invention

The present invention relates to the protection of an integrated circuit chip against laser attacks.

2. Discussion of the Related Art

FIG. 1 is a simplified cross-section view of an integrated circuit chip 1 formed inside and on top of a semiconductor substrate 3. Substrate 3 comprises, in its upper portion, an active layer 5, presently an epitaxial layer, in which are formed electronic components, not shown. Presently, active layer 5 is covered with a stack of insulating layers 7 and of conductive interconnect tracks 9. Several successive interconnect levels are generally provided. Conductive vias, not shown, cross the insulating layers to connect the conductive tracks together, to input-output terminals 11 of the chip, and to components of active layer 5, thus forming the circuit interconnections.

In certain devices, for example, secure components such as payment cards, regions of active area 5 are capable of processing and/or of storing critical data, for example, ciphering keys. Such devices may undergo a tampering aiming at obtaining protected confidential data.

Among known attacks, so-called "fault attacks" comprise deliberately disturbing the operation of a chip, and analyzing the influence of disturbances on its operation. The attacker especially studies the influence of disturbances on data such as output signals, the consumption, or response times. He is likely to deduce therefrom, by statistic studies or others, critical data such as the algorithms used and, possibly, ciphering keys.

To deliberately cause faults in the circuits of a chip, an attack mode comprises bombarding local areas of the chip with a laser beam. Fault can thus be injected into certain memory cells and/or the behavior of certain components may be altered. It should be noted that in a laser attack, the chip needs to be powered.

Due to the presence of the metal interconnect tracks on the front surface side of the substrate, laser attacks are, in many cases, performed on the back side of the chip. Indeed, on the front surface side, the probability for a laser beam to reach a component through the tangle of metal tracks is close to zero. Further, the attacker cannot afford to remove the interconnect levels since this would make the chip inoperative and impossible to analyze.

FIG. 2 is a simplified cross-section view of chip 1 illustrating a preliminary thinning-down step of substrate 3, frequently implemented before a back-side laser attack. Such a step improves the efficiency of the laser attack by reducing the beam attenuation by the substrate. To make the components of active region 5 accessible to the laser beam, the attacker needs to remove a portion of the thickness of substrate 3 from its lower surface or back side. As an example, a chip formed from a substrate having a 180-µm thickness will undergo a thickness decrease on the order of 130 µm before a laser attack.

To be protected against frauds, an attack detection device, coupled to a protection circuit, is generally provided in secure chips. When an attack is detected, the protection circuit implements measures of protection, alienation, or destruction of the critical data. For example, it may be provided, when an attack is detected, to interrupt the power supply of the chip, to reset the chip, and/or to reduce the time during which the attacker may examine the chip response to a disturbance.

Attack detection solutions may be logical. They, for example, comprise regularly introducing, into the calculations, integrity tests enabling to make sure that the data are not being modified. Such solutions have the disadvantage of introducing additional calculation steps, thus increasing the chip response times. Further, integrity tests may not detect all the disturbances caused by an attacker. The latter thus has some room for maneuver that can enable him to acquire critical data.

Other so-called physical attack detection solutions especially comprise sensors sensitive to temperature variations, to ultraviolet rays, or to X rays, enabling to detect suspicious activities. Like logic solutions, such solutions are not perfectly reliable. Indeed, before the attack is detected, the attacker has room for maneuver to obtain critical data. Further, the implementation of such solutions is complex and increases the silicon surface area necessary to form the chip.

SUMMARY OF THE INVENTION

An object of an embodiment of the present invention is to provide a system for protecting an integrated circuit chip against laser attacks, which overcomes at least some of the disadvantages of prior art solutions.

An object of an embodiment of the present invention is to provide such a system, which can reinforce or even replace prior art solutions.

An object of an embodiment of the present invention is to provide such a system enabling to prevent the attacker from obtaining critical data before the attack is detected by usual means.

Thus, an embodiment of the present invention provides a method for protecting, against laser attacks, an integrated circuit chip formed inside and on top of a semiconductor substrate and comprising, in the upper portion of the substrate an active portion in which components are formed, this method comprising the steps of: forming in the substrate a gettering area extending under the active portion, the upper limit of said area being at a depth ranging between 5 and 50 µm from the upper surface of the substrate; and introducing diffusing metal impurities into the substrate.

According to an embodiment of the present invention, the forming of the gettering sites comprises a step of deep implantation of a rare gas in the substrate, followed by an anneal step.

According to an embodiment of the present invention, the rare gas is helium.

According to an embodiment of the present invention, the area extends across a thickness ranging between 0.5 µm and 5 µm.

According to an embodiment of the present invention, the gettering sites are formed by precipitation of oxygen.

According to an embodiment of the present invention, the area extends all the way to the rear surface of the substrate.

According to an embodiment of the present invention, the method comprises a step of implantation of metal atoms in the substrate.

According to an embodiment of the present invention, at the end of the step of introduction of metal impurities into the substrate, the area contains metal atoms at a concentration ranging between $10^{17}$ and $10^{18}$ atoms/cm$^3$.

According to an embodiment of the present invention, the metal impurities comprise iron atoms.

The foregoing objects, features, and advantages of the present invention will be discussed in detail in the following non-limiting description of specific embodiments in connection with the accompanying drawings.

DETAILED DESCRIPTION

Figure 1:
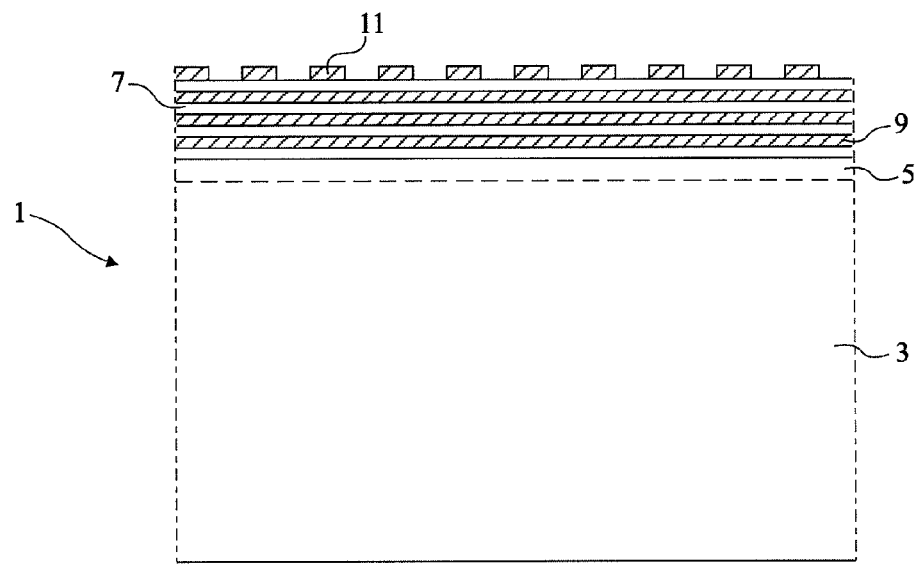
FIG. 1, previously described, is a simplified cross-section view of a portion of an integrated circuit chip.

For clarity, the same elements have been designated with the same reference numerals in the different drawings and, further, as usual in the representation of integrated circuits, the various drawings are not to scale.

An aspect of an embodiment of the present invention is to provide, in the substrate, a protection layer capable of attenuating and of scattering a possible attack laser beam to broaden the beam and to prevent it from reaching a precise area of the active portion. Further, at each point of the chip, the laser power will be decreased.

Figure 2:
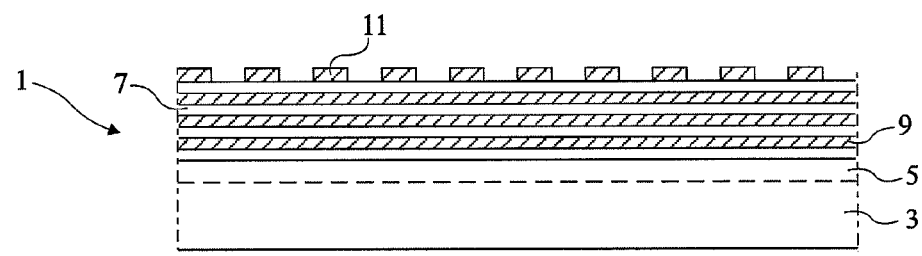
FIG. 2, previously described, is a simplified cross-section view of the chip portion of FIG. 1 after thinning down of its substrate.
Figure 3:
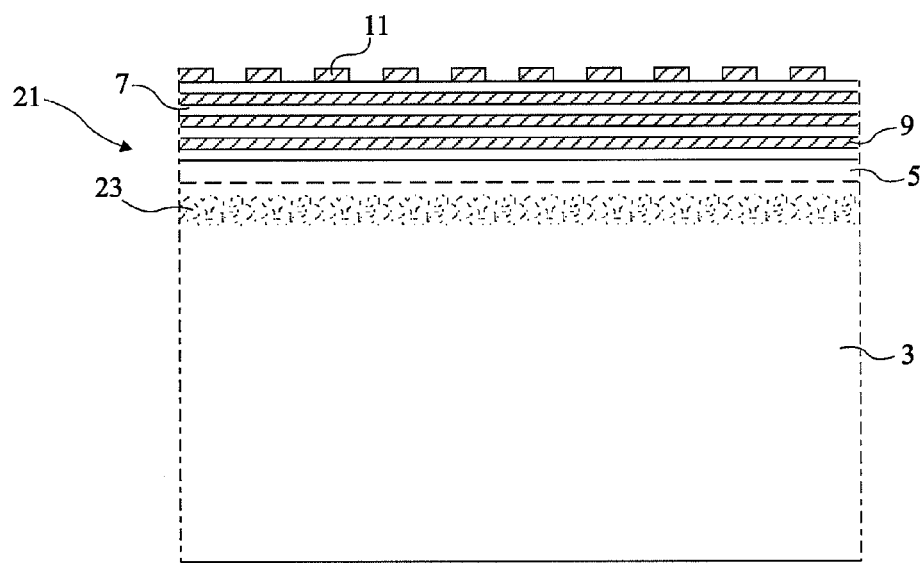
FIG. 3 is a cross-section view schematically showing an embodiment of an integrated circuit chip provided with a system of protection against laser attacks.

FIG. 3 is a cross-section view schematically showing an embodiment of an integrated circuit chip 21 provided with a system of protection against laser attacks. Like chip 1 described in relation with FIG. 2, chip 21 is formed inside and on top of a substrate 3. Substrate 3 comprises, under an active portion 5 in which the chip components are formed, an area 23 capable of scattering a laser beam.

In area 23, gettering sites capable of retaining metal impurities have been formed. Area 23 comprises a strong concentration of intentionally introduced metal impurities, for example, iron, nickel, copper, or gold atoms.

The provision of gettering areas in a semiconductor substrate has been provided to clear the active substrate regions of impurities capable of degrading the performances of certain components. Such gettering areas have the function of retaining possible parasitic impurities introduced into the substrate during the manufacturing, so that these impurities do not contaminate active regions of the substrate. Such techniques are especially used in the field of power semiconductor devices.

An example of a method for forming a gettering area comprises providing, in a local region of the substrate, an implantation at high dose of a rare gas such as helium, argon, or xenon. An adapted consecutive anneal causes the forming of bubbles and/or of dislocations in this region. The defects thus formed happen to be gettering sites capable of retaining possible metal impurities present in the substrate.

After having formed gettering area 23, for example, according to the above-mentioned method, it is provided to intentionally contaminate the substrate, for example, by implantation of iron atoms. The impurities thus introduced concentrate in area 23 and are retained therein. These impurities enable to diffract/scatter/attenuate a possible attack laser beam, thus shielding the components of chip 21.

Contaminated gettering area 23 should be placed at a sufficiently low distance from active layer 5 so that, in the previous thinning step, the attacker cannot remove it without damaging the chip. Currently, active layer 5 in which the chip components are formed has a thickness approximately ranging from 3 μm to 10 μm. After thinning down according to usual techniques, substrate 3 has a thickness on the order of 50 μm. A more significant thinning down would risk to cause an unbalance of the mechanical stress exerted on the chip. The interconnect tracks and vias would especially risk to break, thus making the chip impossible to use.

Thus, as an example, contaminated gettering area 23 may have a thickness approximately ranging from 0.5 μm to 5 μm and be formed, under active area 5, at a distance ranging between 12 μm and 20 μm from the upper surface of substrate 3. However, the present invention is not limited to this specific case. A gettering area extending over almost the entire thickness of substrate 3, from its rear surface to a distance of a few μm, for example approximately ranging from 5 μm to 20 μm, from active layer 5, may, for example, be provided.

Figure 4:
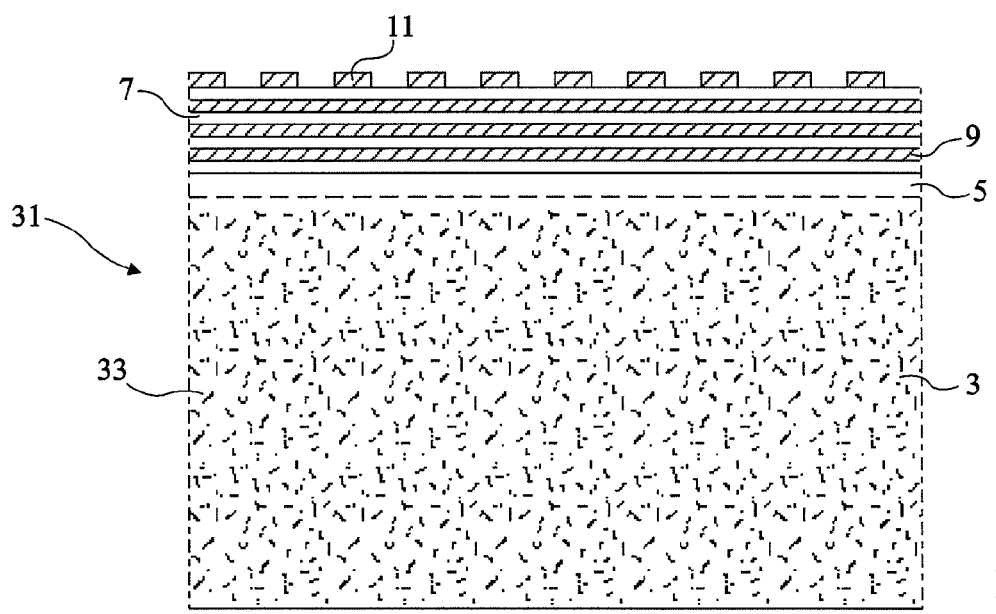
FIG. 4 is a cross-section view schematically showing an alternative embodiment of an integrated circuit chip provided with a system of protection against laser attacks.

FIG. 4 is a cross-section view schematically showing an alternative embodiment of an integrated circuit 31 provided with a system of protection against laser attacks. In this example, as compared with chip 21 described in relation with FIG. 3, thin contaminated gettering area 23 has been replaced with an extensive gettering area 33. Gettering area 33 extends from the rear surface of the substrate all the way to a distance approximately ranging from 5 μm to 20 μm from active area 5.

Chip 31 may, for example, be manufactured inside and on top of a silicon wafer formed according to the "MDZ®" technology (for "Magic Denuded Zone"). Such wafers are especially described in article "Effective intrinsic gettering for 200 mm and 300 mm P/P-wafers in a low thermal budget 0.13 μm advanced CMOS logic process", by M. J. Binns, disclosed in 2002 at the "9$^{th}$ Int. Symp. Silicon Materials Science & Technology, Philadelphia, May 12-17, 2002" Conference, available on website "http://www.memc.com/". Such a wafer indeed comprises, in the substrate, gettering sites previously formed by oxygen precipitation. The sites are distributed across a large part of the substrate thickness, from the rear surface to a few tens of μm away from the front surface. Such sites are capable of concentrating and of retaining possible metal impurities.

A step of intentional contamination of the substrate, for example, by implantation of iron atoms, such as described hereabove, is then provided.

The concentration of metal impurities in area 23 (FIG. 3) or 33 (FIG. 4) will preferably be chosen to be high. This concentration especially depends on the gettering method forming process as well as on the method used to introduce metal impurities into this layer. As an example, in the case of a thin gettering area such as area 23 of FIG. 3, gettering sites may be formed by implantation of helium at 40 keV and $5 \times 10^{16}$ atoms/cm$^2$, followed by an adapted anneal. An implantation of iron atoms through the rear surface of the substrate may consecutively be implemented, at 100 keV and $10^{12}$ atoms/cm$^2$, to obtain a final concentration of iron atoms in area 23 approximately ranging from $10^{17}$ to $10^{18}$ atoms/cm$^3$.

An advantage of the provided protection system is that it compels the attacker to considerably increase, for example by a factor on the order of from 10 to 100, the laser beam power to be able to inject faults into the chip circuits. Accordingly, before the attacker can acquire critical data, the attack will be easily detected by conventional means, for example, temperature variation detectors.

Further, the presence of the contaminated gettering area makes it difficult for the attacker to control the size and the position of the laser beam at the level of the active chip area.

Another advantage of the provided protection system is that it requires no modification of the chip circuits which are desired to be protected, nor any modification of the manufacturing process. Further, the manufacturing steps necessary to form the contaminated gettering area are compatible with usual integrated circuit chip manufacturing methods. The provided system can thus be employed to easily protect any type of circuit, at a lesser cost. Further, such a protection system does not increase the silicon surface area necessary to form the chip.

Specific embodiments of the present invention have been described. Various alterations and modifications will occur to those skilled in the art.

In particular, the present invention is not limited to the use of the metals mentioned hereabove to form the metal impurities concentrated under the active chip portion. It will be within the abilities of those skilled in the art to use any other adapted metal.

Further, a concentration of metal atoms in the gettering area approximately ranging from $10^{17}$ to $10^{18}$ atoms/cm$^3$ has been mentioned hereabove. It will be within the abilities of those skilled in the art to adapt the protection system by using different concentrations. Moreover, the thicknesses and the depths mentioned hereabove for the different layers of an integrated circuit chip and especially for the gettering layer are given as an example only. It will be within the abilities of those skilled in the art to implement the desired operation by using different thicknesses and depths.

Various techniques for forming gettering areas capable of concentrating and of retaining metal impurities introduced into a semiconductor substrate have been mentioned hereabove. The present invention is not limited to these specific examples. It will be within the abilities of those skilled in the art to implement the desired operation whatever the method used to form the gettering area.

Similarly, it has been provided to intentionally contaminate the substrate, after forming of the gettering area, by implantation of metal atoms. It will be within the abilities of those skilled in the art to implement the desired operation whatever the method used to introduce metal impurities at the desired concentration in the gettering area.

A system of protection of an integrated circuit chip against laser attacks has been described hereabove, this system comprising a gettering area in which metal impurities have been intentionally introduced. However, other applications to the provision of such a contaminated gettering area may be provided. Thus, the present invention aims at an integrated circuit chip comprising a gettering area, extending under the active portion of the chip, at a short distance from the active portion, and comprising a strong concentration of metal impurities.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for protecting, against laser attacks, an integrated circuit chip formed inside and on top of a semiconductor substrate and comprising in the upper portion of the substrate an active portion in which components are formed, the method comprising the steps of:
    forming, in the substrate, a gettering area extending under the active portion, the upper limit of said gettering area being at a depth ranging between 5 and 50 μm from the upper surface of the substrate; and
    performing a manufacturing process to introduce diffusing metal impurities into the substrate, the manufacturing process being performed in accordance with a target concentration of metal impurities in the gettering area.

2. The method of claim 1, wherein the forming of the gettering sites comprises a step of deep implantation of a rare gas into the substrate, followed by an anneal step.

3. The method of claim 2, wherein the rare gas is helium.

4. The method of claim 2, wherein said area extends across a thickness ranging between 0.5 μm and 5 μm.

5. The method of claim 1, wherein the gettering sites are formed by precipitation of oxygen.

6. The method of claim 5, wherein said area extends all the way to a rear surface of the substrate opposite the active portion in which the components are formed.

7. The method of claim 1, wherein performing the manufacturing process in accordance with the target concentration comprises performing an implantation of metal atoms in the substrate, the implantation being performed in accordance with the target concentration.

8. The method of claim 1, wherein performing the manufacturing process to introduce metal impurities into the substrate comprising introducing metal impurities into the substrate so as to result in said gettering area containing metal atoms at a concentration ranging between $10^{17}$ and $10^{18}$ atoms/cm$^3$.

9. The method of claim 1, wherein the metal impurities comprise iron atoms.

10. A method comprising:
    populating a gettering area of a substrate with metal impurities in accordance with a target concentration of metal impurities in the gettering area.

11. The method of claim 10, further comprising:
    forming the gettering area in the substrate, the substrate having a first side and a second side opposite the first side, the gettering area beginning at a depth between 5 and 50 μm from the first side of the substrate.

12. The method of claim 11, wherein forming the gettering area comprises forming the gettering area extending from the depth between 5 and 50 μm from the first side through an entirety of the thickness of the substrate to the second side.

13. The method of claim 10, wherein populating the gettering area with the metal impurities comprises populating in accordance with a target concentration of metal impurities in the gettering area between $10^{17}$ and $10^{18}$ atoms/cm$^3$.

14. The method of claim 10, wherein populating the gettering area with the metal impurities comprises populating in accordance with a target concentration of metal impurities in the gettering area that will create a concentration of metal impurities sufficient to diffract, scatter, and/or attenuate a laser beam.

15. The method of claim 10, wherein populating the gettering area with the metal impurities comprises performing a manufacturing process at an energy level corresponding to a target depth for the populating, the target depth for the populating matching a depth of the gettering area.

16. The method of claim 10, wherein populating in accordance with the target concentration of metal impurities in the gettering area comprises implanting the metal impurities in accordance with a target concentration of metal impurities in the gettering area.

17. The method of claim 10, wherein populating the gettering area with the metal impurities forms a protection layer for an integrated circuit, the protection layer comprising the metal impurities in the gettering area, the protection layer preventing a laser beam from compromising operations of the integrated circuit.

18. The method of claim 10, further comprising:
configuring a manufacturing process to be performed in accordance with the target concentration.

19. The method of claim 18, further comprising:
selecting the target concentration of metal impurities in the gettering area.

20. A method comprising:
setting an energy level for implanting metal impurities to a depth of a gettering area in a substrate;
setting a target concentration of the metal impurities in the gettering area; and
implanting the metal impurities according to the energy level and the target concentration.

21. The method of claim 20, wherein the substrate comprises a first side and a second side opposite the first side, and wherein the method further comprises:
forming, on a first side of a substrate, an active layer comprising at least one functional component; and
forming at least one interconnect track conductively connected to the active layer.

22. The method of claim 21, wherein implanting the metal impurities comprises implanting the metal impurities on the second side of the substrate.

23. The method of claim 20, further comprising:
forming the gettering area in the substrate, the substrate having a first side and a second side opposite the first side, the gettering area beginning at a depth between 5 and 50 µm from the first side of the substrate.

24. The method of claim 23, wherein forming the gettering area comprises forming the gettering area extending from the depth between 5 and 50 µm from the first side through an entirety of the thickness of the substrate to the second side.

25. The method of claim 20, wherein setting the target concentration comprises setting the target concentration between $10^{17}$ and $10^{18}$ atoms/cm$^3$.

26. The method of claim 20, wherein setting the target concentration comprises setting a target concentration of metal impurities in the gettering area that will create a concentration of metal impurities sufficient to prevent a laser beam from compromising operations of the integrated circuit.

27. A method comprising:
forming an integrated circuit, the integrated circuit comprising a substrate, an active layer comprising at least one functional component, and at least one interconnect track,
wherein forming the integrated circuit comprises forming a protection layer in the substrate to prevent a laser beam from compromising operations of the active layer.

28. The method of claim 27, wherein forming the integrated circuit comprises forming the substrate, forming the active layer above the substrate, and forming the at least one interconnect track above the active layer.

29. The method of claim 27, wherein forming the protection layer in the substrate comprises:
forming a gettering area in the substrate; and
populating the gettering area with metal impurities at a concentration sufficient to prevent a laser beam from compromising operations of the active layer.

30. The method of claim 29, wherein populating the gettering area with metal impurities comprises populating the gettering area with metal impurities at a concentration between $10^{17}$ and $10^{18}$ atoms/cm$^3$.

31. The method of claim 27, wherein:
forming the integrated circuit comprises forming the active layer on a first side of the substrate; and
forming the protection layer comprises forming the protection layer in the substrate beginning at a depth between 5 and 50 µm from the first side of the substrate.

32. The method of claim 31, wherein the substrate has a second side opposite the first side, and wherein forming the protection layer comprises forming the protection layer extending from the depth between 5 and 50 µm from the first side through a thickness of the substrate to the second side.

33. The method of claim 27, wherein forming the protection layer to prevent a laser beam from compromising operations of the active layer comprises forming a protection layer to diffract, scatter, and/or attenuate a laser beam.

* * * * *